(12) United States Patent
Dokumaci et al.

(10) Patent No.: US 7,041,600 B2
(45) Date of Patent: May 9, 2006

(54) METHODS OF PLANARIZATION

(75) Inventors: Omer Dokumaci, Wappingers Falls, NY (US); Bruce Doris, Brewster, NY (US); David Horak, Essex Junction, VT (US); Fen F. Jamin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 10/604,196

(22) Filed: Jun. 30, 2003

(65) Prior Publication Data

US 2004/0266195 A1 Dec. 30, 2004

(51) Int. Cl.
*H10L 21/302* (2006.01)

(52) U.S. Cl. ............... 438/692; 438/691; 438/693; 438/710

(58) Field of Classification Search ............... 438/691, 438/692, 693, 697, 698, 706, 710, 745, 7
See application file for complete search history.

(56) References Cited

U.S. PATENT DOCUMENTS

| 6,440,638 | B1 | 8/2002 | Golz et al. ............ 430/313 |
| 6,683,340 | B1* | 1/2004 | Kim et al. ............ 257/300 |
| 6,753,249 | B1* | 6/2004 | Chen et al. ............ 438/637 |
| 6,841,479 | B1* | 1/2005 | Cherian et al. ............ 438/690 |
| 6,852,208 | B1* | 2/2005 | Ashjaee et al. ............ 205/137 |

* cited by examiner

*Primary Examiner*—Lan Vinh
(74) *Attorney, Agent, or Firm*—Connolly, Bove, Lodge & Hutz LLP

(57) ABSTRACT

A method of planarization allows for the use of chemical mechanical polishing (CMP) in starting structures having films not generally suitable for CMP processes. Two material layers are formed over a starting structure, and the upper layer is planarized in a CMP process. A nonselective etch is then used to transfer the planar topography to the lower level.

14 Claims, 3 Drawing Sheets

METHODS OF PLANARIZATION

BACKGROUND OF INVENTION

1. Technical Field

The technical field is methods of planarization. More particularly, the technical field includes planarization methods involving chemical mechanical polishing.

2. Related Art

Planarization is critical in microelectronics processing. Planarization is required in wafer fabrication, shallow trench isolation (STI), dual damascene processes, in the production of flat surfaces for multilevel metal processing, and in many other processes. Chemical mechanical polishing (CMP) is one method of planarization. However, many materials are not suitable for chemical mechanical polishing because they are too soft. CMP processes tend to excessively scratch soft materials, with the polished soft material collecting in the CMP polishing pad and reducing the life of the pad. Soft material also contaminates the CMP pad so that the pad cannot be used to polish wafers having different film materials. Organic spin-on films are one class of materials that generally have good planarization properties, but are regarded as unsuitable for CMP processing.

FIGS. 1A and 1B are process diagrams illustrating a conventional method of planarization. The planarization method can be used to implant a gate using an organic spin-on film. Referring to FIG. 1A, a starting structure includes a patterned wide gate 12 and narrower gates 14 on a substrate 10. An organic film 20 is disposed over the starting structure, and is used to implant the gates 12, 14 independently from the substrate 10, thereby rendering the gates 12, 14 conductive. The film 20 is thin over the gates 12, 14, at regions 22, 26, respectively, and thicker over the substrate 10 between the gates 12, 14, at regions 28. The region 22 is thicker than the region 26.

Referring to FIG. 1B, an etching step is performed to remove the film 20 from over the gates 12, 14, while leaving the remainder of the substrate 10 covered by a resultant film 29. Once the tops of the gates 12, 14 are exposed, the gates 12, 14 can be implanted without implanting the substrate 10, so long as the remaining organic film 29 over the substrate 10 is thick enough to prevent implantation of the substrate 10.

A problem with the above method is that the thickness of the film 20 over the gates 12, 14 is dependent on the length and width of the gates 12, 14 and the surrounding pattern around the gates 12, 14, as shown in FIG. 1A. If a gate''s length and width are too large, a thicker film will be deposited over the larger gate than over a smaller gate. This is illustrated by the thick region 22 over the large gate 12. As shown in FIG. 1B, after etching the film over the small gates 14, some film may remain over the large gate 12. The film over the large gate 12 may prevent some gate implant from entering the large gate 12. Alternatively, if the film over the large gate 12 is completely etched away (not illustrated), the film over the top of the surrounding substrate 10 may be etched too thin to block the gate implant from entering the substrate 10.

The method illustrated in FIGS. 1A and 1B illustrate problems arising from nonuniform thicknesses of spin-on materials over gates that are to be implanted. However, similar difficulties arise in other situations where structures with topography are covered with spin-on materials and the structures are selectively exposed and subjected to further processing.

SUMMARY OF INVENTION

According to a first embodiment, a method of planarization comprises providing an article comprising a substrate and one or more structures disposed on the substrate, forming a first material over the starting structure, forming a second material over the first material, removing at least a portion of the second material by chemical mechanical polishing, and removing at least a portion of the first material.

Those skilled in the art will appreciate the advantages and benefits of various embodiments of the invention upon reading the following detailed description of the embodiments with reference to the below-listed drawings.

According to common practice, the various features of the drawings are not necessarily drawn to scale. Dimensions of various features may be expanded or reduced to more clearly illustrate the embodiments of the invention.

BRIEF DESCRIPTION OF DRAWINGS

The detailed description will refer to the following drawings, wherein like numerals refer to like elements, and wherein.

DETAILED DESCRIPTION

According to the present invention, materials may be planarized to a desirable form and thickness. Soft or ductile materials, which may otherwise be inappropriate for CMP processes, are suitable for the planarization method according to the present invention.

Figure 1A:
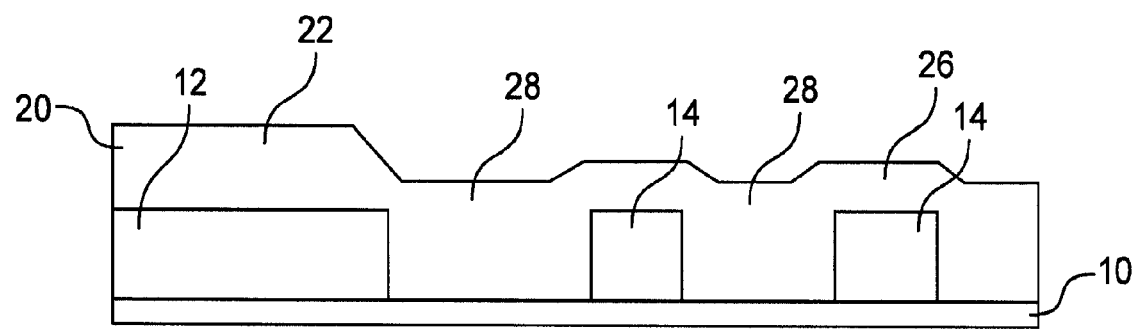
FIGS. 1A–1B illustrate a conventional planarization method.
Figure 1B:
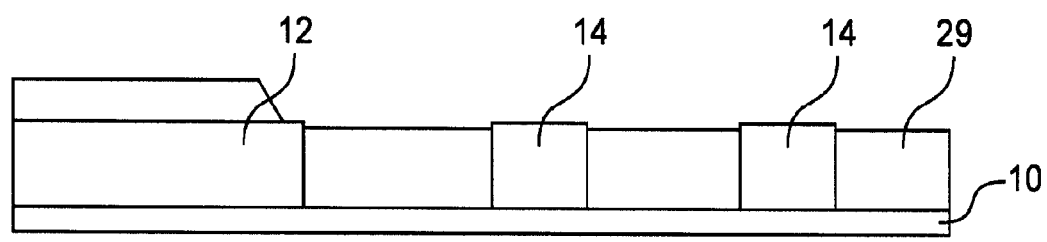
Figure 2A:
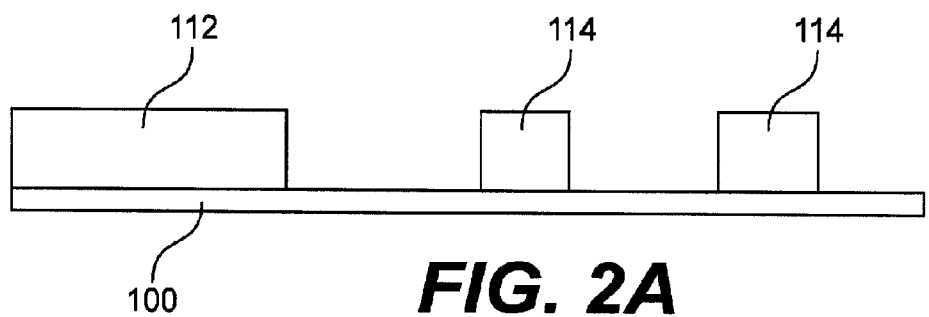
FIGS. 2A–2F illustrate a method of planarization according to an embodiment of the present invention.

Referring to FIG. 2A, the illustrated article is a starting structure comprising gates 112, 114 disposed over a substrate 100. The gates 112, 114 can comprise materials such as, for example, polysilicon, tungsten silicide, cobalt silicide, and nickel silicide. The gates 112, 114 can be formed from a layer of polysilicon by, for example, an etching process. The gate 112 may have relatively large length and width dimensions (when viewed from a plan perspective, not shown) as compared to the gates 114, which may have relatively small length and width dimensions. The gate 112 will be referred to as the "large" gate, and the gates 114 will be referred to as the "small" gates. The terms "large" and "small" indicate the relative sizes of the plan view surface areas, or "footprints" of the gates 112,114.

Figure 2B:
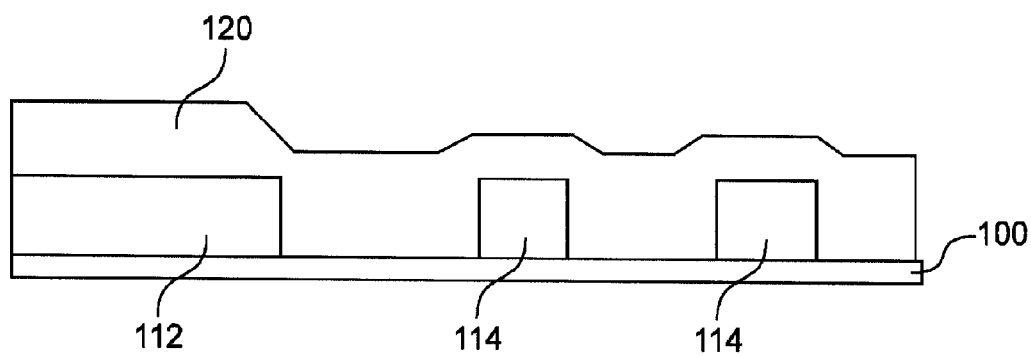

Referring to FIG. 2B, a first material 120 is formed over the starting structure illustrated in FIG. 2A. The first material 120 has a topography that requires planarization. The first material 120 may be, for example, a relatively soft or ductile material that is generally considered unsuitable for conventional CMP planarization methods. Examples of such materials are spin-on organics and spin-on films with a high concentration of organic material.

Figure 2C:
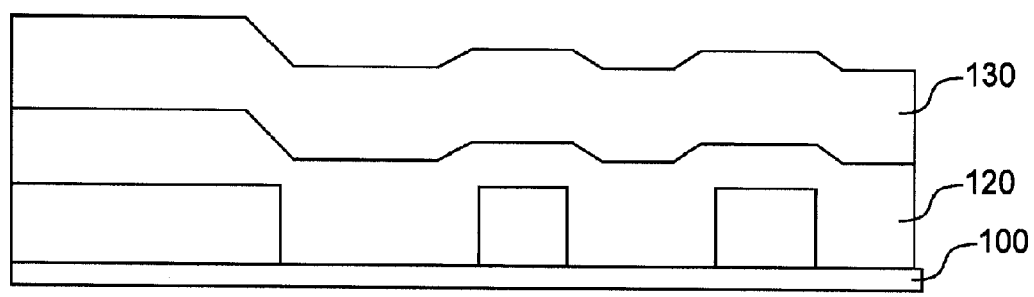

Referring to FIG. 2C, a second material 130 is deposited over the first material 120. The second material 130 is preferably relatively hard or less ductile as compared to the first material 120. The second material 130 is also preferably suitable for planarization by CMP. In general, most films are considered to be suitable for CMP. Examples of suitable materials include tetra ethyl ortho silicates (TEOS) and high density plasma (HDP) oxide, many kinds of CVD materials, such as, for example, PECVD and low-k CVD materials, deposited amorphous spin-on organic glasses, glasses applied by chemical vapor deposition, Si, HDP $SiO_2$, spin-on $SiO_2$, TEOS, and HDP PECVD.

The topography of the second material 130 is similar to the topography of the first material 120. If the second material 130 is spun on, then the topography of the second material 130 will be somewhat less pronounced than that of the first material 120.

Figure 2D:
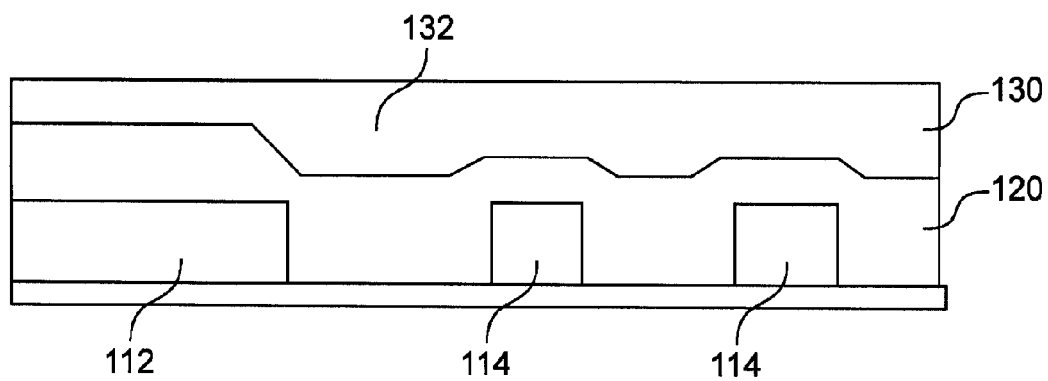

Referring to FIG. 2D, the second material 130 is planarized. CMP is a preferred method for planarizing the second material 130. Chemical mechanical polishing (CMP) involves abrasives materials and some chemical oxidizers. In general, a polishing pad is used to remove a chemically oxidized film on a wafer by polishing the wafers with the pad. The polishing pad is attached to a rotating table and a wafer is attached to a carrier head. The pad is rotated while a polishing slurry flows between the wafer and the polishing pad. Abrasives materials such as silica, ceria or alumina are suitable for use in the polishing pad and/or in the slurry. Other materials may be used, depending upon the material used to form the oxidized film. A hard polyurethane pad may be used, for example.

CMP does not require an abrasive slurry. In this case, the polishing pad may be abrasive, and a simple flow of liquid may be used to remove material from the polishing site. Alternatively, both the slurry and the pad may contain abrasives.

Referring again to FIG. 2D, the CMP process may be carried out using, for example, conventional or fixed abrasives polish, with a hard polishing pad. The CMP planarization process is capable of polishing the second material 130 over the large gate 112 at a higher rate than a "down" area 132 of the second material 130. After planarization, the sum thickness of the materials 120 and 130 over the large gate 112 is approximately equal to the sum thickness of the materials 120 and 130 over the small gates 114. Addition of the CMP-suitable second material 130 allows the formation of a substantially flat topography over the substrate 100 using chemical mechanical polishing.

Figure 2E:
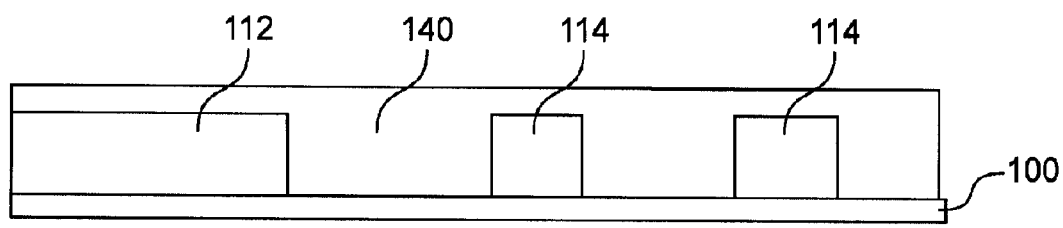

Referring to FIG. 2E, an etching step is used to etch the second material 130 and the first material 120. The etching step may translate the flat topography from the material 130 shown in FIG. 2D to the first material 120 shown in FIG. 2E. A nonselective etch, which etches differing materials at nearly equal rates, may be used. A nonselective etch increases the likelihood of the flat topography of the second material 130 shown in FIG. 2D being transferred to the first material 120. For example, the nonselective etch can be performed using $NF_3/Ar$, which etches all exposed materials at nearly equal rates. After the nonselective etch, a layer 140 remains over the gates 112, 114 and the substrate 100.

Figure 2F:
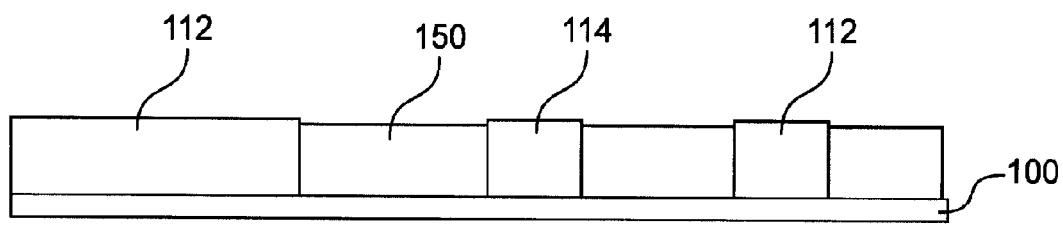

Referring to FIG. 2F, a second etch may be performed, if necessary. For example, a selective etch may be used to recess the layer 140 below the gates 112, 114, as shown in FIG. 2F. The selective etch results in material 150 disposed over the substrate 100 between the gates 112, 114.

In this embodiment, the material 150 resulting from the selective etch should be thick enough to prevent implantation of the substrate 100. The ultimate thickness of the material 150 may therefore be selected according to the method of implantation used. The selective etch may also leave a thin layer of the material 150 over the gates 112, 114. In this embodiment, the layer should be thin enough to allow implantation of the gates 112, 114.

The method discussed above is described in terms of selectively exposing the upper surfaces of gates which may be subsequently exposed to ion implantation processes. However, the above planarization method can be used to selectively expose a variety of components or structures for any purpose. For example, any process in which a component is partially or wholly exposed at a top part of the component, while the area of the substrate surrounding the component remains covered by a secondary material, is suitable for planarization as discussed above.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

The invention claimed is:

1. A method of planarizing, comprising:
providing an article comprising a substrate and one or more structures disposed on the substrate;
forming a first material over the article;
forming a second material over the first material;
removing at least a portion of the second material using a polishing pad and a liquid; and
removing at least a portion of the first material,
wherein the second material is harder than the first material and none of the first material is removed when the at least a portion of the second material is removed.

2. The method of claim 1, wherein the liquid contains abrasives, forming a slurry.

3. The method of claim 1, wherein the polishing pad comprises abrasives.

4. The method of claim 1, wherein removing at least a portion of the second material comprises:
forming a substantially planar surface from the second material.

5. The method of claim 4, wherein the second material is harder than the first material.

6. The method of claim 4, further comprising: removing an additional portion of the second material.

7. The method of claim 6, wherein removing at least a portion of the first material comprises: farming a substantially planar surface from the first material.

8. The method of claim 6, wherein removing an additional portion of the second material comprises: removing all of the second material remaining on the first material.

9. The method of claim 6, wherein the portion of the first material and the additional portion of the second material are removed by etching.

10. The method of claim 9, wherein the etching comprises: etching using nonselective etching conditions.

11. The method of claim 10, comprising: removing more of the first material by a subsequent etching of the first material.

12. A method of planarizing, comprising:
providing an article comprising a substrate and one or more structures disposed on the substrate, the structures providing the article with a non-planar topography;
forming a first material over the article;
forming a second material over the first material, wherein the second material is harder than the first material;
removing at least a portion of the second material using a polishing pad and a liquid, wherein removing the portion of the second material provides the second material with a substantially planar topography;
removing an additional portion of the second material and at least a portion of the first material using nonselective etching conditions, wherein none of the second material remains after removing the portion of the first material, and wherein the first material is provided wit a substantially planar topography; and
removing more of the first material by a subsequent etching of the first material,
wherein none of the first material is removed when the at least a portion of the second material is removed.

13. The method of claim 12, wherein the liquid contains abrasives, forming a slurry.

14. The method of claim 12, wherein the polishing pad comprises abrasives.

* * * * *